(12) United States Patent
Cho (10) Patent No.: US 6,741,195 B1
(45) Date of Patent: May 25, 2004

(54) LOW GLITCH CURRENT STEERING DIGITAL TO ANALOG CONVERTER AND METHOD

(75) Inventor: Kwang-Bo Cho, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/317,678

(22) Filed: Dec. 11, 2002

(51) Int. Cl.[7] ............................................. H03M 1/66
(52) U.S. Cl. ....................... 341/136; 341/135; 323/315
(58) Field of Search .................................. 341/133, 135, 341/136, 144; 323/315, 316

(56) References Cited

U.S. PATENT DOCUMENTS

| | | | |
|---|---|---|---|
| 5,598,095 A | 1/1997 | Schnaitter | 323/315 |
| 5,739,780 A * | 4/1998 | Cheng et al. | 341/135 |
| 5,742,245 A | 4/1998 | Noro | 341/144 |
| 5,790,060 A | 8/1998 | Tesch | 341/119 |
| 5,861,830 A | 1/1999 | Cheng et al. | 341/135 |
| 5,892,471 A | 4/1999 | Mahant-Shetti et al. | 341/135 |
| 6,008,747 A | 12/1999 | Iida | 341/135 |
| 6,072,413 A | 6/2000 | Hirasawa | 341/144 |
| 6,407,688 B1 | 6/2002 | Greig | 341/136 |
| 6,448,917 B1 | 9/2002 | Leung et al. | 341/144 |
| 6,507,304 B1 | 1/2003 | Lorenz | 341/144 |
| 6,509,854 B1 * | 1/2003 | Morita et al. | 341/144 |
| 6,542,098 B1 | 4/2003 | Casper et al. | 341/144 |
| 6,559,784 B1 | 5/2003 | Schofield et al. | 341/144 |
| 2002/0008653 A1 * | 1/2002 | Nishimura | 341/154 |

* cited by examiner

Primary Examiner—Howard L Williams
(74) Attorney, Agent, or Firm—Dorsey & Whitney, LLP (57) ABSTRACT

A current steered digital to analog converter (DAC) circuit includes a reference input transistor, a plurality of current steered current sources each coupled to the reference input transistor and configured to provide a combined current source output and an output current mirror having an input coupled to the combined current source output. The output current mirror provides current gain to enable the DAC circuit to provide the required output current magnitude, while at the same time, enabling the DAC itself to operate with a smaller reference current into the DAC. The output current mirror may advantageously be either a regulated cascode current mirror or a high-swing cascode current mirror.

18 Claims, 8 Drawing Sheets

LOW GLITCH CURRENT STEERING DIGITAL TO ANALOG CONVERTER AND METHOD

TECHNICAL FIELD

The present invention relates to a video Digital-to-Analog Converter (DAC). In particular, the invention relates to a video DAC that uses current mirrors with input/output current controllability to achieve low-power consumption and a low-glitch current steered output.

BACKGROUND OF THE INVENTION

Figure 1:
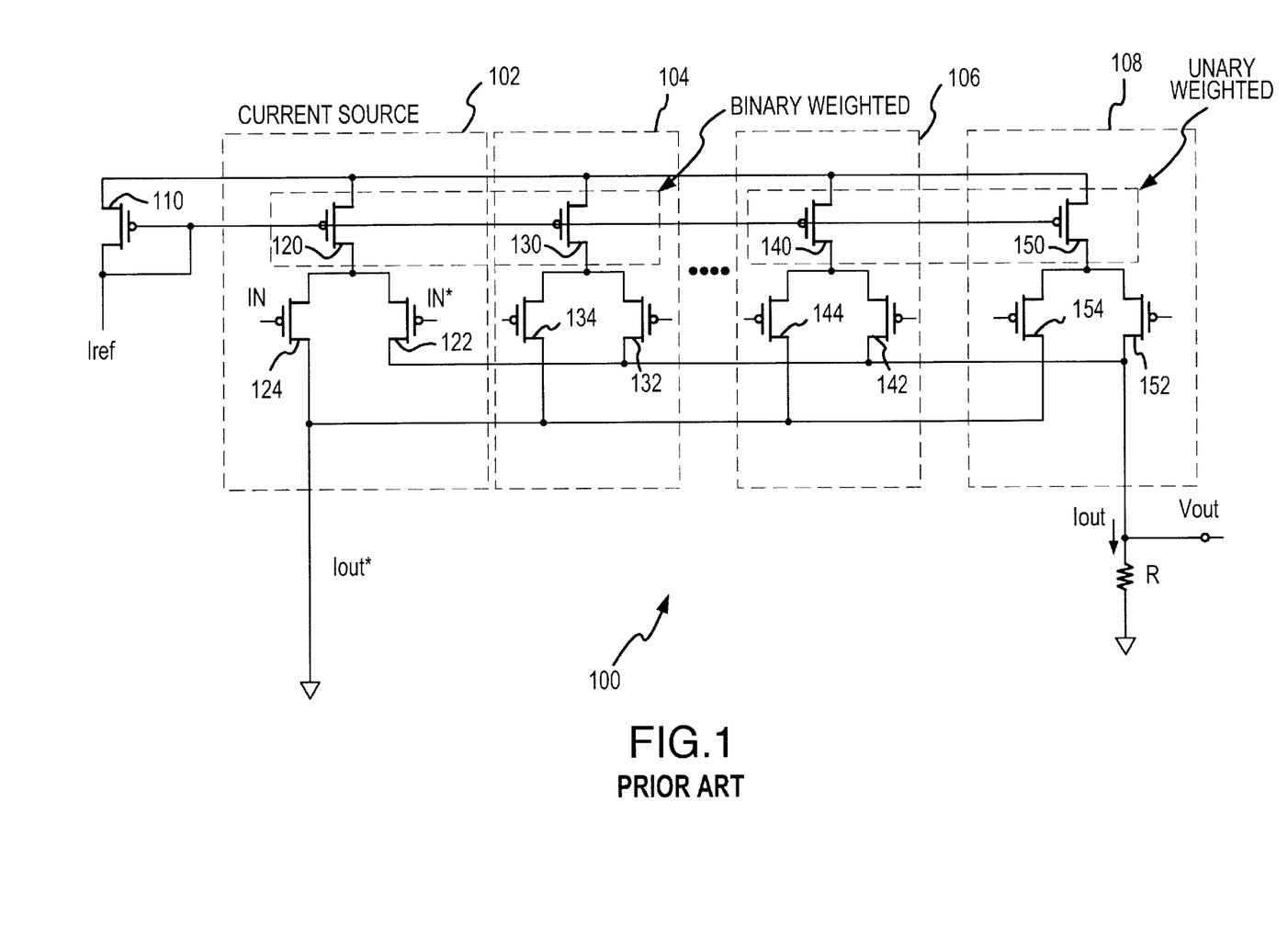
FIG. 1 is a schematic diagram of a prior art video DAC circuit.

The function of a DAC is to generate a voltage having a magnitude that corresponds to the value of a digital signal. A variety of DAC designs are known, one of which is a current steering DAC. In a current steering DAC, a current having a magnitude corresponding to the value of a digital signal flows through a resistor to generate a voltage having a magnitude corresponding to the digital signal. FIG. 1 is a schematic of a known example of current steering DAC 100 using a resistor R to convert an output current $I_{OUT}$ into an output voltage $V_{OUT}$. The output current $I_{OUT}$ is generated by 4 current sources 102, 104, 106, 108, although a fewer or greater number of current sources can be used. Each of the current sources 102, 104, 106 and 108 is selectively enabled by a respective complimentary input signal IN, IN*. Only IN, IN* for the current source 102 is shown for clarity. The DAC 100 is often implemented in a semiconductor integrated circuit without the resistor R. In such a case, the resistor R is separately mounted on a circuit board and connected to the semiconductor integrated circuit as shown in FIG. 1.

The DAC 100 may be either unary or binary. In a unary DAC, the currents generated by all of the current sources are identical. In a binary DAC, the currents generated by the current sources are binary weighted so that the current sources generate respective currents of I, 2I, 4I, 8I, etc. A DAC may also include both types of current sources, which is referred to as a segmented or hybrid DAC.

With further reference to FIG. 1, the DAC 100 includes, in addition to the current sources 102, 104, 106 and 108 and the resistor R, a diode-coupled reference transistor 110 through which a reference current Iref flows. The current source 102 includes a mirror transistor 120 having its source and gate coupled in parallel with a source and gate of the reference transistor 110. As a result, the current through the mirror transistor 120 corresponds to, but is not necessarily equal to, the magnitude of the current through the reference transistor 110. The current flowing through the mirror transistor 120 is steered through either a first switching transistor 122 if IN is high or a second switching transistor 124 if IN is low. If the current is steered through the first switching transistor 122, the current contributes to the current $I_{OUT}$ flowing through the resistor R. Alternatively, if the current is steered through the second switching transistor 124, the current contributes to the current $I_{OUT}*$.

The remaining current sources 104, 106 and 108 operate in substantially the same manner as the current source 102. More specifically, each current source 104, 106 and 108 includes a respective mirror transistor 130, 140, 150, a respective first switching transistor 132, 142, 152 to steer the current through the $I_{OUT}$ path, thereby contributing to the magnitude of the output voltage $V_{OUT}$, and a respective second switching transistor 134, 144, 154 to steer the current through the $I_{OUT}*$ path. Thus, each current source 102, 104, 106 and 108 contributes to an increase in the current $I_{OUT}$, and hence $V_{OUT}$, if the respective complimentary inputs IN, IN* are active.

The DAC 100 shown in FIG. 1 is a segmented or hybrid DAC since it includes both unary current sources and binary current sources. More specifically, the current sources 106, 108 are unary because the mirror transistors 140, 150 are matched to the reference transistor 110, and the gates of the reference and mirror transistors 110, 140, 150 are all connected together, so that transistors 140, 150 source a current exactly equal to Iref. However, for the DAC to be unary, it is not necessary for the current sourced by each of the mirror transistors 140, 150 to be equal to Iref as long as the currents sourced by the mirror transistors 140, 150 are equal to each other. The DAC 100 may include a lesser or greater number of current sources 102, 104, 106 and 108 than shown in FIG. 1. For example, a unary DAC may include 7 current sources in order to provide a current to signal $I_{OUT}$ that may selectively be any of zero or 1, 2, 3, 4, 5, 6 or 7 times Iref. Thus, a conventional binary-to-decimal encoding circuit (not shown) can generate from a 3 bit binary number, the voltages to apply to the gates of the 7 current sources to form what is sometimes called a thermometer or ladder DAC.

As mentioned above, the DAC 100 is a segmented or hybrid DAC because it includes binary current sources as well as unary current sources. In the DAC 100, the current sources 102, 104 are binary because the mirror transistors 120, 130 are not matched to the reference transistor 110. Instead, each mirror transistor 120, 130 is binary scaled with respect to reference transistor 110 and each other so that transistors 120, 130 source a current that is a predetermined multiple of Iref, and also the current through one of the transistors 120, 130 is binary weighted with respect to the current through the other transistor of transistors 120, 130. For example, if the mirror transistor 120 is scaled so that it sources a current that is one times Iref, then the mirror transistor 130 is scaled so that it sources a current that is two times of Iref. By controlling the control voltages applied to the respective current sources 102, 104, the current contributing to Iout can be selectively controlled to be either zero, one, two or three times Iref. Although, in the DAC 100 shown in FIG. 1, one of the currents supplied by one of binary current sources is equal to Iref, this is not required as long as the currents supplied by the binary current sources are binary weighted. A binary DAC may advantageously include more current sources, in increasing binary scale, to achieve greater bit depth.

The segmented or hybrid DAC shown in FIG. 1 may include a fewer or greater number of current sources. For example, a segmented DAC includes a 5 binary current sources with the most significant bit of the binary DAC scaled to source a current that is 16 times Iref, and 7 unary current sources of the type discussed above with each current source scaled to source a current that is 32 times Iref. With proper control of the control voltages applied to the current stages, such a segmented DAC can operate to convert of an 8 bit byte of digital data into a current $I_{OUT}$ that varies from zero up to 255 times Iref in increments of Iref. The segmented architecture is most frequently used to combine high conversion rate and high resolution. In this architecture the least significant bits steer binary weighted current sources, while the most significant bits are thermometer or ladder encoded and steer a unary current source array.

The DAC 100 shown in FIG. 1 and similar DACs have drawbacks. For example, since any current from a current source that does not contribute to $I_{OUT}$ is essentially wasted, and the power consumption of the DAC 100 can be considerably greater than the power dissipated in the resistor R.

In addition, the DAC 100 and similar DACs are prone to produce a glitch or output spike. For example, at the half-scale transition when the most significant bit (MSB) is turned on (or off) and all the other bits are turned off (or on), a glitch having a maximum amplitude will occur. The glitch is mainly due to the following effects:

1) imperfect synchronization of the control voltages, which causes different current sources 102–108 to turn on or off at different times;
2) channel length modulation of the mirror transistors 120, 130, 140, 150 in the respective current sources 102–108 due to voltage fluctuations, particularly $V_{OUT}$;
3) charge and discharge of parasitic capacitances associated with the current sources 102–108;
4) feed through of digital control voltages to the output of current sources 102–108; and
5) non-symmetrical operation of the switching transistors in the respective current sources 102–108 that can cause both switching transistors in a current source to be simultaneously on or off for a short period.

SUMMARY OF THE INVENTION

A DAC circuit according to the invention includes a reference input transistor, a plurality of current steered current sources each coupled to the reference input transistor and configured to provide a combined current source output and an output current mirror having an input coupled to the combined current source output. The output current mirror provides current gain to enable the DAC circuit to provide the required output current magnitude while at the same time, enabling the DAC itself to operate with a smaller reference current into the DAC. The output current mirror advantageously is either a regulated cascode current mirror or a high-swing cascode current mirror to provide improved linearity over the operating range of the DAC circuit.

In another example of the DAC circuit according to the invention, the output current mirror includes an input transistor and at least two output transistors. Each of the output transistors are coupled in series through a respective selection switch (e.g., transistor) before being coupled to the output terminal of the DAC circuit. By providing selection control signals to the selection switches, the current gain of the output current mirror is selectively controllable. An advantage of using an output current mirror as discussed is that glitches and output spikes are reduced as if a low pass filter were applied.

In still another example of the DAC circuit according to the invention, the DAC circuit further includes an input current mirror that receives the reference current, the input current mirror includes an input transistor and at least two output transistors. Each of the output transistors are coupled in series through a respective selection switch (e.g., transistor) before being coupled to a reference input transistor coupled to the current sources of the current steered DAC. By providing selection control signals to the selection switches, the current gain of the input current mirror is selectively controllable to accommodate a range of reference current sources.

BRIEF DESCRIPTION OF THE DRAWINGS

The invention will be described in detail in the following description of preferred embodiments with reference to the following figures wherein.

DETAILED DESCRIPTION OF THE INVENTION

Figure 2:
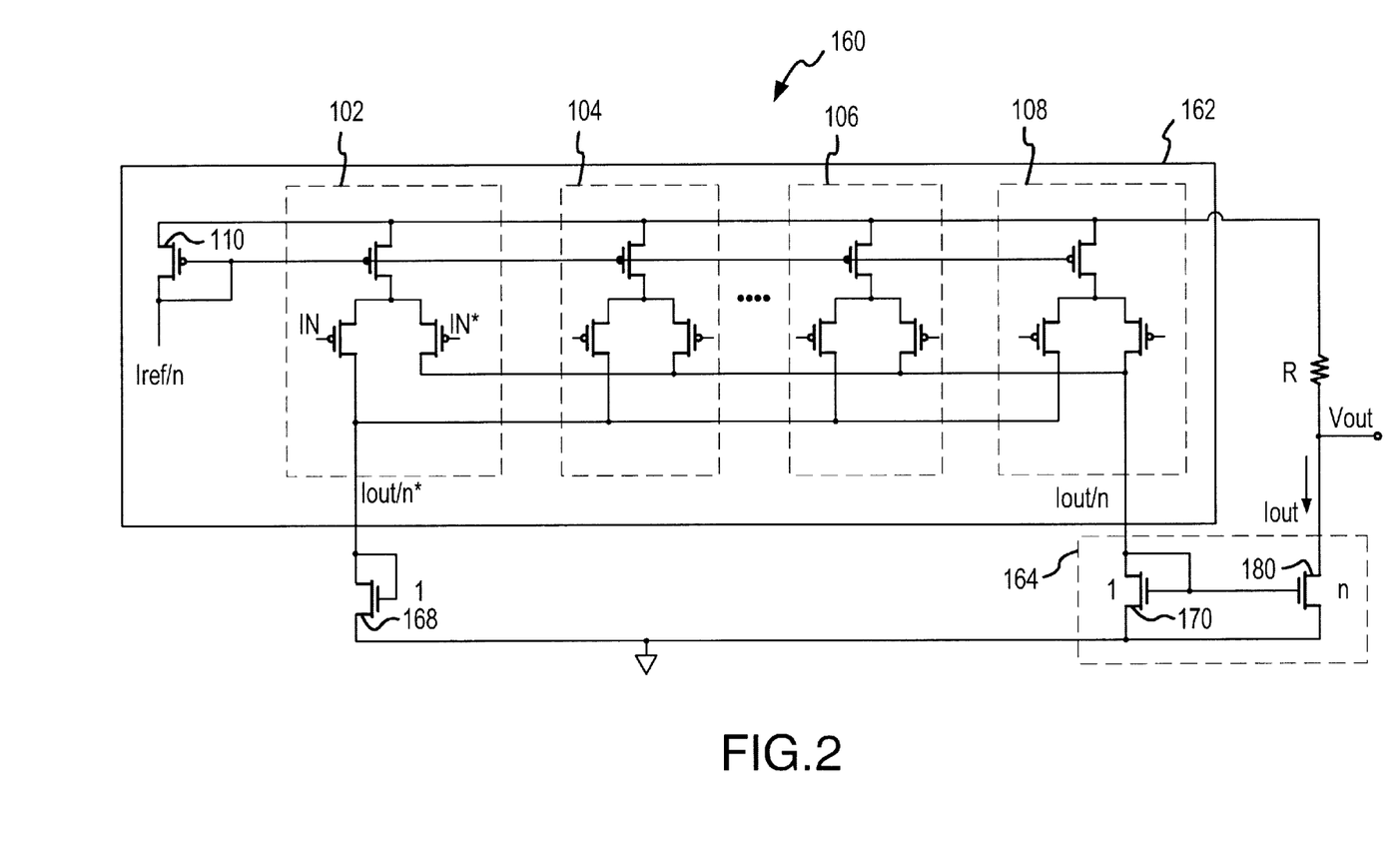
FIG. 2 is a schematic diagram of a DAC circuit according to one embodiment of the present invention.

One embodiment of a DAC 160 shown in FIG. 2 uses most of the same components 162 used in the prior art DAC 100 of FIG. 1. Therefore, in the interest of brevity, the components of the DAC 160 that are identical to the components of the DAC 100 have been provided with the same reference numerals, and an explanation of their structure and operation will not be repeated. The DAC 160 differs from the DAC 100 by coupling the current sources 102, 104, 106 and 108 to the output resistor R through an output current mirror 164. Since the current mirror 164 inverts the polarity of the current signal, the resistor R is coupled between Vout and a positive potential as shown in FIG. 2. Additionally, a transistor 168 is placed in the $I_{OUT}^*$ path to balance the load driven by the current sources 102–108. The output current mirror 164 includes input transistor 170 through which the currents from the current sources 102–108 flow, and an output transistor 180 generating an output current $I_{OUT}$ that flows through the resistor R to provide an output voltage $V_{OUT}$. The output transistor 180 is scaled with respect to the input transistor 170 so that the transistor 180 sinks a current that is n times the current flowing through the input transistor 170. As a result, the input current that the current sources 102–108 must apply to the input transistor 170 is only $I_{OUT}/n$. As a result, the current sourced from the reference transistor 110 is reduced by a factor of n, assuming that the current sources 102–108 of the DAC 160 are configured like the current sources 102–108 of the DAC 100 in FIG. 1. In this event, the wasted current $I_{OUT}^*$ sunk to ground is reduced by a factor of n, but the output current $I_{OUT}$ of the DAC 160 is maintained at the same level. The total current consumed by the DAC 160 is reduced to $I_{OUT}^*/n+I_{OUT}/n+I_{OUT}$ instead of $I_{OUT}^*+I_{OUT}$ as in the DAC 100.

The value of n is preferably between 10 and 100, but may advantageously extend to as much as 1000. As n becomes larger, the current Iref/n can be reduced, and the current through the reference transistor can be reduced quite small, for example, as small as a micro Ampere or so. At 1 micro Ampere for Iref/n, and n equal to 100, an 8 bit DAC could sink an Iout current as much as 25.5 milliAmperes. The total average current ($I_{OUT^*}/n+I_{OUT}/n+I_{OUT}$) consumed by the DAC 160 of FIG. 2 would be 13.005 milli Amperes instead of 25.5 milli Amperes ($I_{OUT^*}+I_{OUT}$) as would be required by the DAC 100 of FIG. 1.

As can be noted in FIG. 2, the current polarity of the signal $I_{OUT}$ is reversed in comparison to the output current polarity from the DAC 100 of FIG. 1. In order to obtain the same polarity signal $I_{OUT}$ from the DAC 160 of FIG. 2, an additional 1:1 PMOS current mirror (not shown) can be used to invert the polarity of the output current $I_{OUT}$ from the DAC 160 of FIG. 2. Alternatively, the 1:n NMOS current mirror 164 in FIG. 2 plus an inverting 1:1 PMOS current mirror (not shown) could function as a two stage current amplifier, and the total gain of n might be apportioned between these two stages in any proportion. For example, if n=100, then the two stage current mirror could be a 1:10 NMOS current mirror followed by a 1:10 PMOS current mirror, or a 1:20 NMOS current mirror followed by a 1:5 PMOS current mirror, or any other proportion. Obviously, three or more stages of current mirrors could also be used. However, since multiple current mirror stages tends to erode the response linearity, it is preferred to redesign the DAC of FIG. 2 into an NMOS current steering DAC 185 (see FIG. 3) instead of the PMOS current steering DAC of FIG. 2. The DAC 185 uses the same components 162, 164, 168 (except for using PMOS transistors instead of NMOS transistors and vice-versa), and it operates in the same manner as the DAC 160 of FIG. 2.

Figure 4:
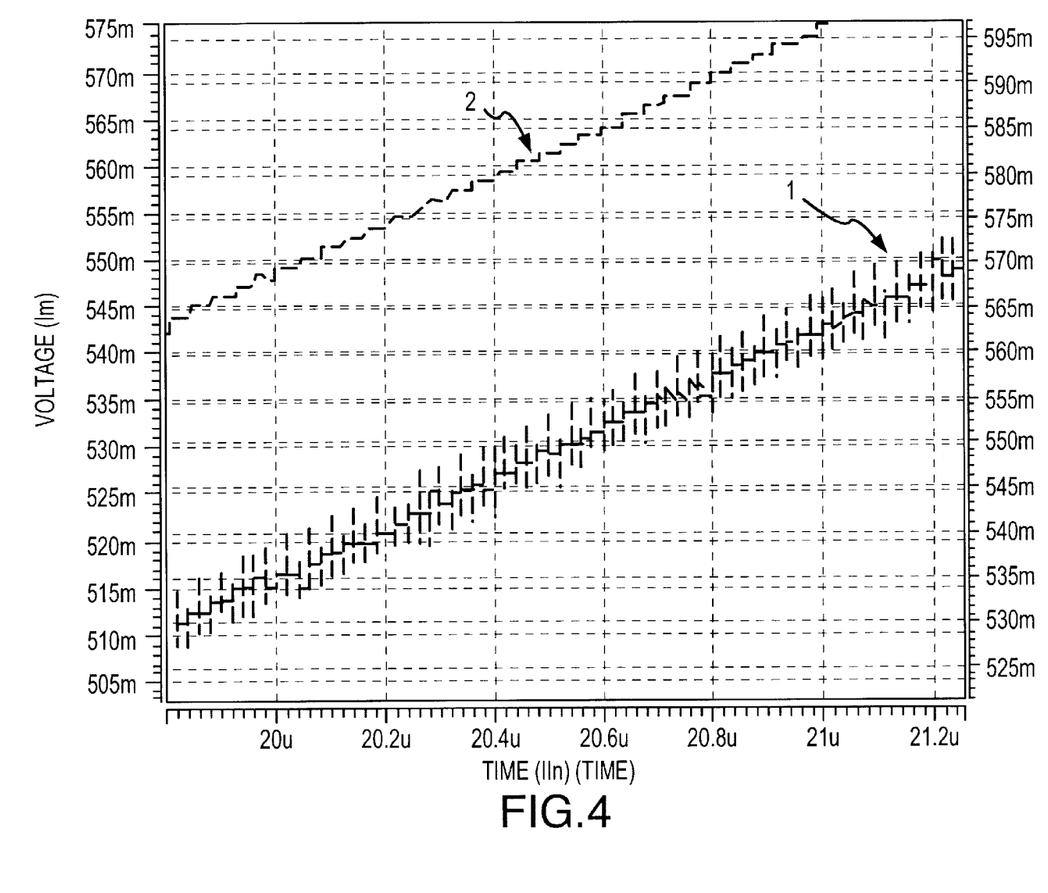
FIG. 4 is a graph depicting an output of the DAC circuit of FIG. 2 in comparison to the conventional DAC circuit of FIG. 1.

FIG. 4 depicts an HSPICE simulation result of digital inputs having a linearly increasing value with time and output curves of the conventional current steering DAC 100 of FIG. 1 and the improved current steering DAC 160 of FIG. 2. FIG. 4 shows the analog output voltage $V_{OUT}$ (plotted on the Y-axis) as a function of time (plotted on the X-axis) as the value of a digital signal applied to the DAC increases with time. The output response 1 of the prior art DAC 100 of FIG. 1 is shown at the bottom of FIG. 4, and the output response 2 of the DAC 160 of FIG. 2 is shown at the top of FIG. 4. As is apparent from FIG. 4, glitches or "spikes" having a relatively large magnitude are generated in the output from the DAC 100 as the current sources 102–108 are switched to and from the resistor R. In contrast, the spikes (or glitches) that appear in the output signal $V_{OUT}$ of the known DAC 100 are mostly absent from the embodiment of the DAC 160 according to the present invention.

The linearity of the response for the DAC 160 shown in FIG. 4 is very good, but it may be further improved. To understand the further improvements, one must understand sources of error. Assume the basic current mirror includes two same size transistors: input transistor M1 and output transistor M2. For example, let input transistor M1 be 170 of FIG. 2, and let output transistor M2 be 180 of FIG. 2, except the transistors are of equal size. Initially, assume that the drain to source voltages for both transistors are equal (i.e., Vds1=Vds2). In real implementations, the output current error is given by e=λ(Vds2−Vds1). Here, e can be reduced by keeping equal Vds values of transistors M1 and M2, and by using a large transistor length since the channel length modulation parameter λ is a function of the length of the transistor. The output resistance can be increased by increasing the transistor length. However, large values of output resistance $r_o$ are difficult to obtain without using more complex configurations.

For further improved linearity, the basic current mirror used in the DAC 160 of FIG. 2 can be replaced by other current mirror configurations, such as a cascode current mirror, a Wilson current mirror, a regulated cascode current mirror, or a high-swing low-voltage current mirror, all of which are well known to one skilled in the art. Such configurations offer stable current values for wide voltage swings and offer enhanced output impedance. These current mirrors can improve the nonlinearity characteristics of the DAC 160.

Table 1 summarizes the performance of the MOS current mirrors having unity gain from the viewpoint of accuracy (linearity), output resistance, the minimum input voltage and the minimum output voltage. From Table 1, it is apparent that regulated and high-swing cascode current mirrors are useful for both high accuracy and low-power supply applications.

TABLE 1

Comparison of MOS current mirror performance.

| MOS current mirror | Accuracy (In = Iout) | rout | Minimum Input Voltage | Minimum Output Voltage |
|---|---|---|---|---|
| Simple | Good | $r_0 = \dfrac{1}{\lambda I_{out}}$ | Vt + Vds(sat) | Vds(sat) |
| Cascode | Better | $g_m r^2_0$ | 2(Vt + Vds(sat)) | Vt + 2Vds(sat) |
| Wilson | Good | $g_m r^2_0$ | Vt + 2Vds(sat) | 2(Vt + Vds(sat)) |
| Regulated Cascode | Better | $g_m^2 r^3_0$ | Vt + Vds(sat) | 2Vds(sat) |
| High-Swing Cascode | Better | $g_m r^2_0$ | Vt + Vds(sat) | 2Vds(sat) |

Figure 3:
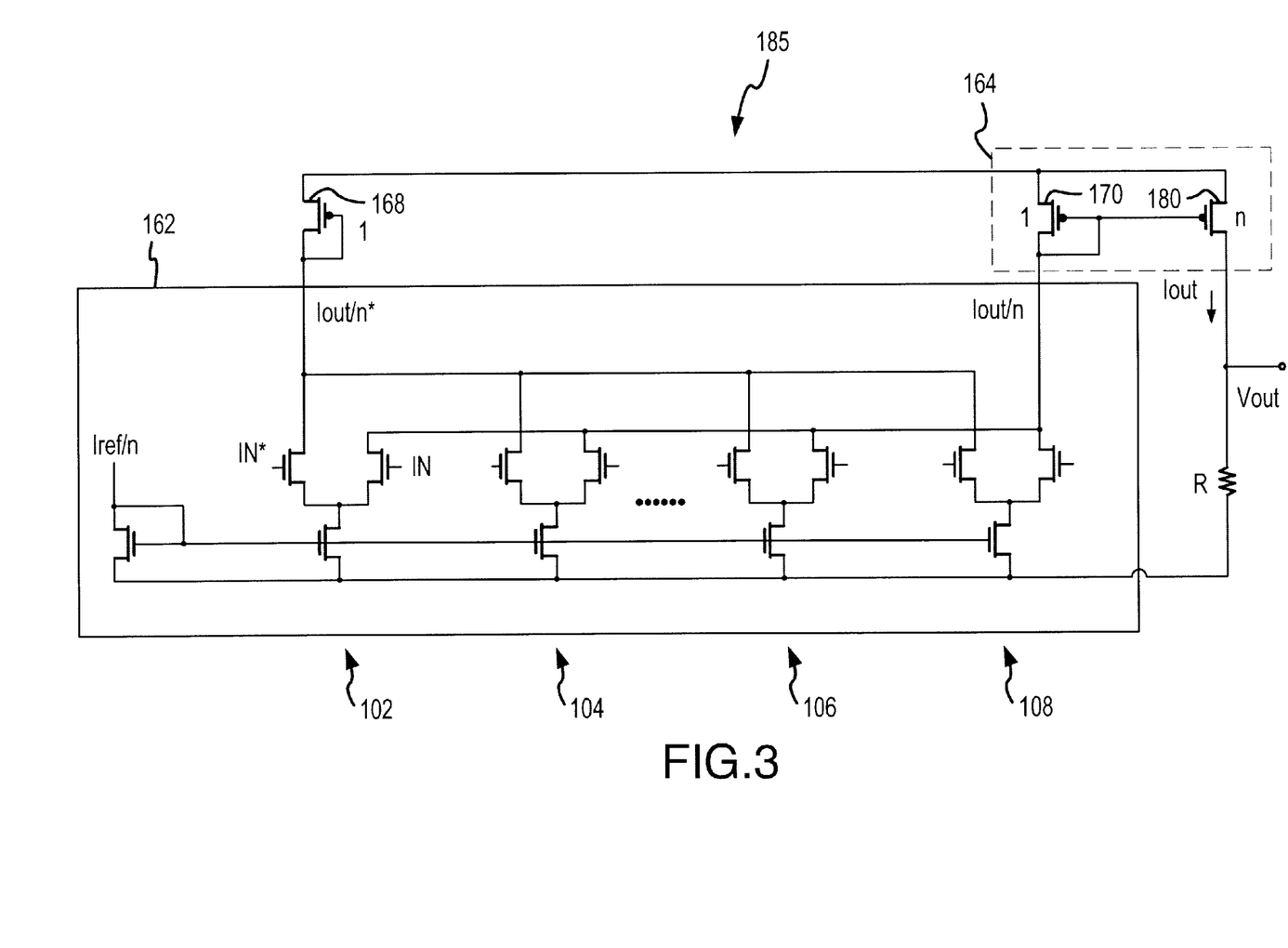
FIG. 3 is a schematic diagram of a DAC circuit according to another embodiment of the present invention.
Figure 5:
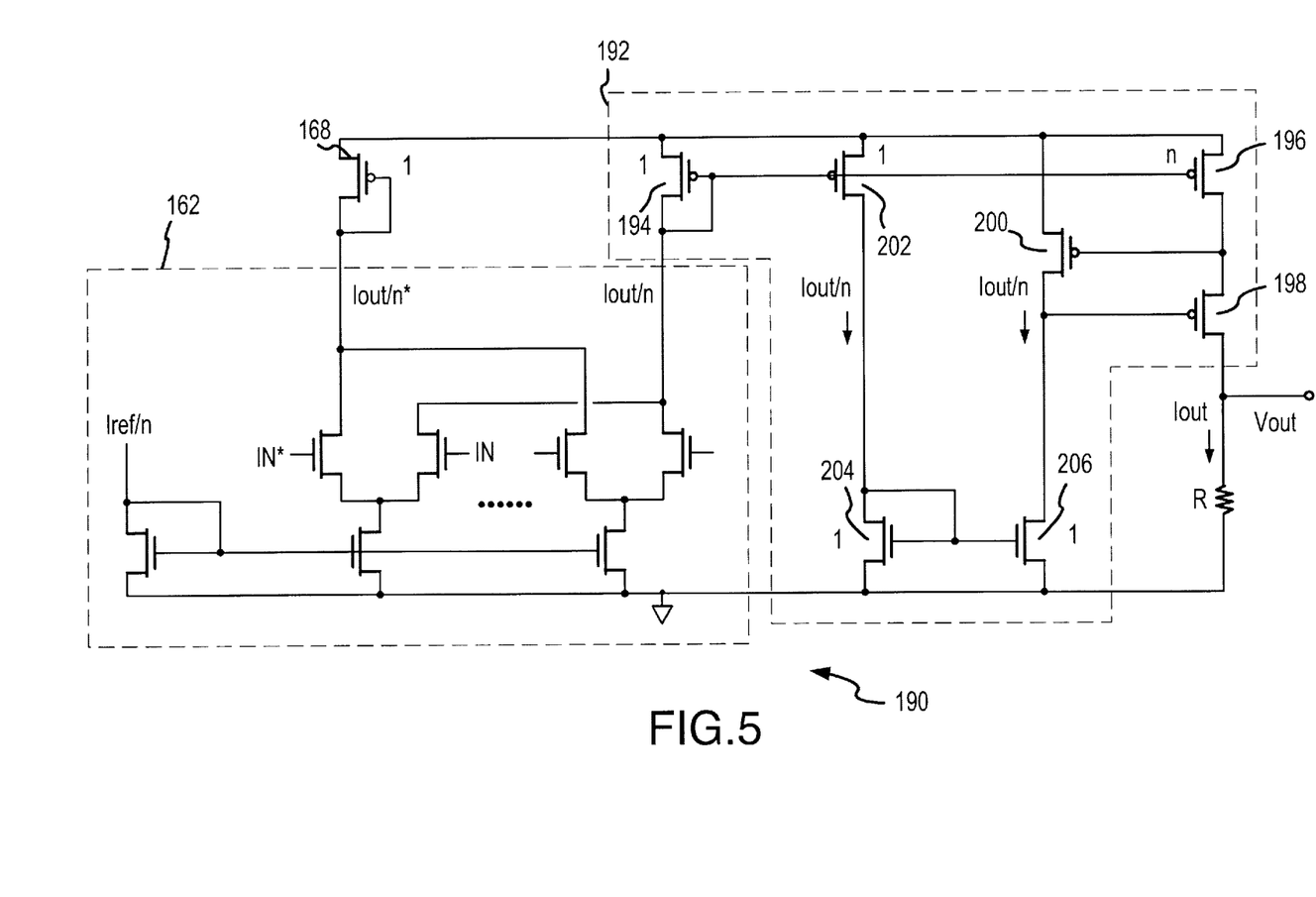
FIG. 5 is a schematic diagram of a DAC circuit according to another embodiment of the present invention using a regulated cascode output current mirror.

Another embodiment of a DAC 190 shown in FIG. 5 uses many of the same components 162, 168 and resistor R that are used in the DAC 185 of FIG. 3; however, the current mirror 164 of FIG. 3 has been replaced with a well known type of regulated cascode current mirror 192 to achieve a new combination. The known regulated cascode current mirror 192 includes PMOS transistors 194, 196 having a 1:n scaling relationship as discussed above with respect to the current mirror 164 of FIG. 3. In addition, the regulated cascode current mirror 192 includes a PMOS transistor 198 in a cascode arrangement with the PMOS transistor 196, and also includes a regulating PMOS transistor 200 in a regulating arrangement with the PMOS transistor 198. It remains necessary to sink a current Iout/n out of the drain of the PMOS transistsor 200 to achieve the regulation of the regulated cascode current mirror. Therefore, a 1:1 mirroring PMOS transistor 202 is provided in a current mirror arrangement with the PMOS transistor 194 to source the current Iout/n into an NMOS current mirror implemented by the NMOS transistors 204, 206. The NMOS current mirror drains the current Iout/n from the drain of the regulating PMOS transistor 200 when PMOS transistor 202 sources the current Iout/n into the NMOS current mirror. In this way, the cascoded output transistors 196 and 198 are regulated by the PMOS transistor 200 to provided a linear output response from the DAC 190, especially when the available power supply voltages are small.

Figure 6:
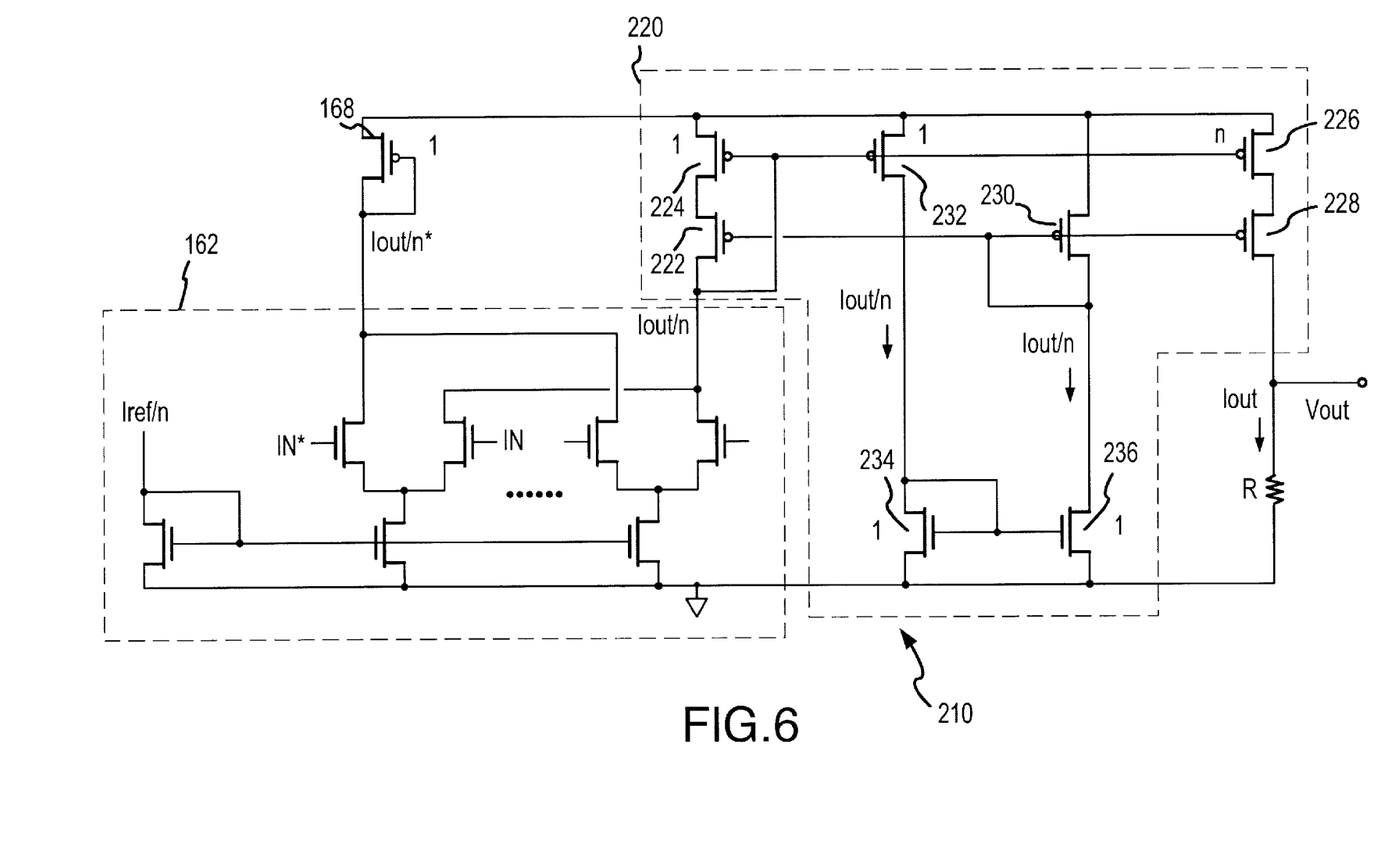
FIG. 6 is a schematic diagram of a DAC circuit according to still another embodiment of the present invention using a high-swing cascode output current mirror.

Another embodiment of a DAC 210 shown in FIG. 6 uses many of the same components 162, 168 and resistor R that are used in the DAC 185 of FIG. 3; however, the current mirror 164 of FIG. 3 has been replaced with a well known type of high-swing cascode current mirror 220. The known high swing cascode current mirror 220 includes PMOS transistor 224 and 226 having a 1:n scaling relationship as discussed with respect to the current mirror 164 of FIG. 3. In additon, the high swing cascode current mirror 220 includes PMOS transistors 222 and 228 in cascode arrangement with the respective PMOS transistors 224 and 226. The gates of the PMOS transistors 222 and 228 are controlled by a control voltage generated by sinking the current Iout/n from a drain of the control transistor 230 as depicted in FIG. 6 so as to divide a voltage across both transistors 222 and 224 and to divide a voltage across both transistors 226 and 228. By dividing these voltages, the transistors 222, 224, 226 and 228 are able to operate in a more linear region of their respective characteristic performance curves. Therefore, a 1:1 mirroring PMOS transistor 232 is provided in a current mirror arrangement with the cascoded PMOS transistors 222 and 224 so that the current Iout/n is sourced from the mirroring transistor 232. The sourced current Iout/n is provided into an NMOS current mirror implemented by the NMOS transistors 234, 236. The NMOS current mirror sinks the current Iout/n from the drain of the control PMOS transistor 230 when PMOS transistor 232 sources the current Iout/n into the NMOS current mirror. By controlling the voltage applied to the gates of transistors 222 and 228 as described, the DAC 210 is able to achieve improved linear response, especially when the available power supply voltages are small.

The simulations discussed above with respect to FIG. 4 simulated 10-bit segmented (5-bit unary+5-bit binary weighted) current steering DACs at 2.8V power supply and 1.3V output with different current mirrors. The different current mirror configurations included no current mirror (i.e., a conventional resistor as in FIG. 1), a simple current mirror as in FIG. 2, a double current mirror to invert the output polarity as discussed above, a regulated cascode current mirror as in FIG. 5 and a high swing cascode current mirror as in FIG. 6. Results demonstrated that the regulated and high swing cascode mirror configurations have the greatest linearity. The DAC variations from pure linear response (i.e., accuracy) as measured by the integral non-linearity (INL) of the output of the regulated and high swing cascode current mirror configurations are kept to less than the least significant bit, and this result is comparable to the linear resistor in the no current mirror configuration. On the other hand, the DAC variations from pure linear response as measured by the INL of the output of the simple current mirror configuration are only kept to less than 4 times the least significant bit, and the DAC variations from pure linear response of the output of the double current mirror configuration are only kept to less than 16 times the least significant bit when measured by the INL. However, the DAC accuracy as measured by the different nonlinearity (DNL) is less than one times the least significant bit for all of the configurations: no current mirror configuration, the simple current mirror configuration, the double current mirror configuration, the regulated cascode current mirror configuration and the high swing cascode current mirror configuration. Thus, the regulated cascode and high swing cascode configurations provide the further improved linearity when such linearity is required.

Figure 7:
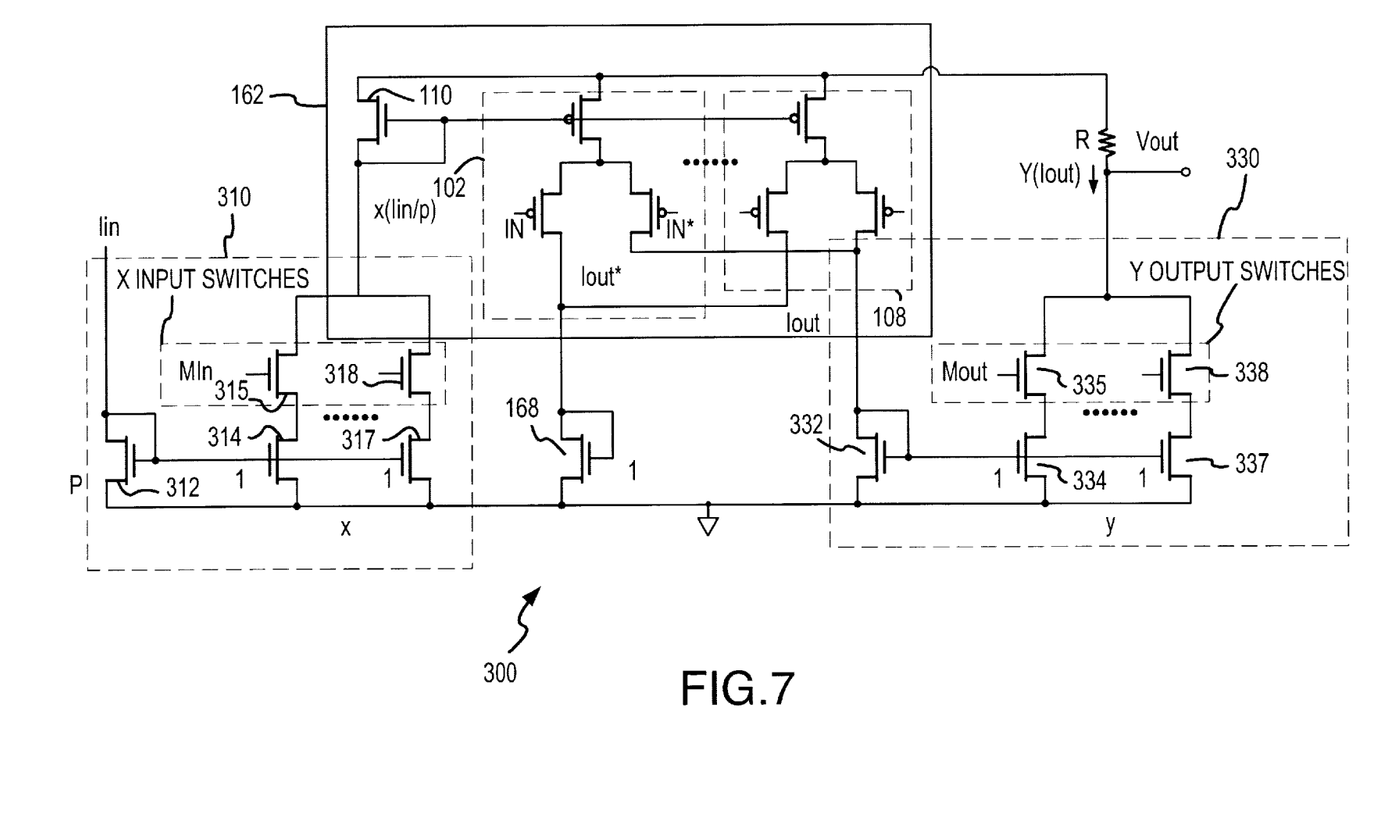
FIG. 7 is a schematic diagram of a DAC circuit according to a further embodiment of the present invention featuring a selectable current gain input current mirror and a selectable current gain output current mirror.

A DAC 300 according to another embodiment of the invention that provides flexibility and low power is shown in FIG. 7. The DAC 300 uses many of the same components (i.e., 162, transistor 168 and resistor R) that are used in the DAC 160 of FIG. 2. However, the current mirror 164 of FIG. 2 has been replaced with an output current mirror 330. Also, an input current mirror 310 has been added to sink a current labeled x(Iin/p) from transistor 110 instead of sinking the current Iref/n as shown in FIG. 2.

In FIG. 7, the input reference current, Iin, is sourced into an input transistor 312 of the input current mirror 310. The input current mirror 310 also includes plural (in this case, two) output transistors 314, 317, each with a respective selection switch 315, 318, the function and operation of which is discussed below. The input transistor 312 is scaled with respect to either of the output transistors 314, 317 to operate as a scaled p:1 current mirror. If the current into the input transistor 312 is Iin, the current through the output transistor 314 is Iin/p when the selection switch 315 is on, and the current through the output transistor 317 is Iin/p when the selection switch 318 is on. The selection switches 315, 318 may advantageously be turned off to prevent current from flowing through the output transistors 314, 317 during operational times when the DAC 300 is not needed, thereby considerably reducing power consumption. For example, by providing a sleep mode in which the selection switches 315, 318 are shut off during, for example, the blanking period of a known NTSC format imaging sensor, much power can be saved. If instead, a source for the input reference current Iin had to be directly shut off and then awakened after the blanking period, the input reference current Iin would require a time interval to stabilize before it could again be used as a reference.

By selectively switching either one or both of the selection switches 315, 318 of the input current mirror 310 to an on state, the input current mirror 310 can be controlled to provide selectable operation at one times or twice normal current. When the output of the DAC 300 is fed into the resistor R (through the output current mirror 330 or any other output current mirror), the selection switches 315, 318 in the input current mirror 310 permit the scale of the voltage applied to the resistor R to be selectively set by controlling whether one or both of the selection switches 315, 318 are turned on.

Although the output transistor 314 of the input current mirror 310 is equal in scale to the output transistor 317 of the input current mirror 310 in the DAC 300 of FIG. 7, the two output transistors 314, 317 might be binary weighted with respect to each other so that the output transistor 317 is scaled to pass twice the current that is passed by the output transistor 314. In this way, the input reference current Iin is reduced by the p:1 scaling of the input transistor 312 and output transistors 314, 317 to provide a reduced input reference current Iin/p, and the selection switches 315, 318 can operate to scale the reduced input reference current Iin/p to be zero, one, two or three times the reduced input reference current Iin/p (i.e., x times Iin/p as depicted in FIG. 7 where x is zero, 1, 2 or 3).

The current Iout out of the components 162 of the DAC 300 is sourced into an input transistor 332 of the output current mirror 330. The output current mirror 330 also includes plural (in this case, two) output transistors 334, 337, each with a respective selection switch 335, 338. The selection switches 335, 338 may advantageously be turned off to prevent current from flowing out of the DAC 300 during operational times when the DAC function is not needed to reduce power consumption.

By selectively switching one or both of the selection switches 335, 338 to an on state, the output current mirror 330 can be controlled to provide selectable output current magnitude at one times or twice the normal output current. When the output of the DAC 300 is fed into the resistor R, the selection switches 335, 338 in the output current mirror 330 permit the scale of the voltage $V_{OUT}$ to be selectively set by controlling whether one or both of selection switches 335, 338 are turned on.

Also, as discussed above with respect to the input current mirror 310, two output transistors 334, 337 of the output current mirror 330 may be scaled to be binary weighted with respect to each other so that in operation with their respective selection switches 335, 338, the selection switches 335, 338 can operate to scale the current y(Iout) through the resistor R of the DAC 300 to be zero, one, two or three times the current Iout out of the component 162 of the DAC 300. The two output transistors 314, 317 of the input current mirror 310 and the two output transistors 334, 337 of the output current mirror 330, respectively, can therefore be used to provide a scalable output current magnitude that is selectable over a wide range. This flexibility provides many advantages. For example, for some video applications, 1V or 1.3V output voltage on a 75 ohm output resistor are needed. Sometimes input and output current tuning may be needed due to process and system environment variations.

Figure 8:
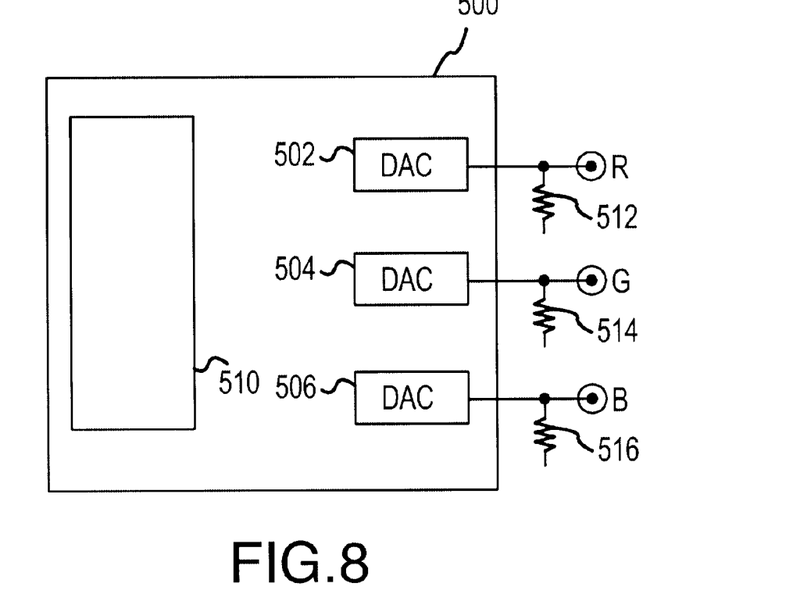
FIG. 8 is a block diagram of a sensor using one of the DAC circuits of FIGS. 2–7 or some other embodiment of a DAC circuit according to the present invention.

FIG. 8 shows a sensor chip 500 that includes a general sensor image array and processing circuits 510 and three DACs 502, 504 and 506 in accordance with another embodiment of the invention. The DACs 502–506 provide output currents into loads 512, 524 and 516 to provide output signal voltages representing red R, green G and blue B signals. The sensor 500 advantageously achieves low power consumption by using the DACs 502, 504 and 506 that are of the type shown in FIG. 2, 3, 5, 6 or 7. Persons of ordinary skill in the art will appreciate that sensor 500 may includes only one DAC (for monochrome) or two DACs for two phases of composite color signals (sometimes referred to as U and V).

As a further example, DACs according to the present invention may be included in an NTSC format imaging sensor 600 as shown in FIG. 8. The output of such sensor might be, for example, red R, green G and blue B as shown in FIG. 8. However, the RGB signals are only needed during the active portion of each scan line. Power consumption is reduced by using the selection switches to shut off current through the DAC during horizontal and vertical blanking intervals.

A single sensor chip having one or more DAC outputs can be designed for multiple applications. In one camera design, the full scale output from a DAC into a 75 ohm load might need to be 1 volt, maximum. In another camera design, the full scale output from a DAC into a 75 ohm load might need to be 1.3 volts, maximum. By use of the selection switches 315, 318, 335, 338, a single sensor chip can be designed and fabricated, but its application can be customized for a particular camera's purpose by applying appropriate control signals to the gates of the selection switches as discussed above.

Figure 9:
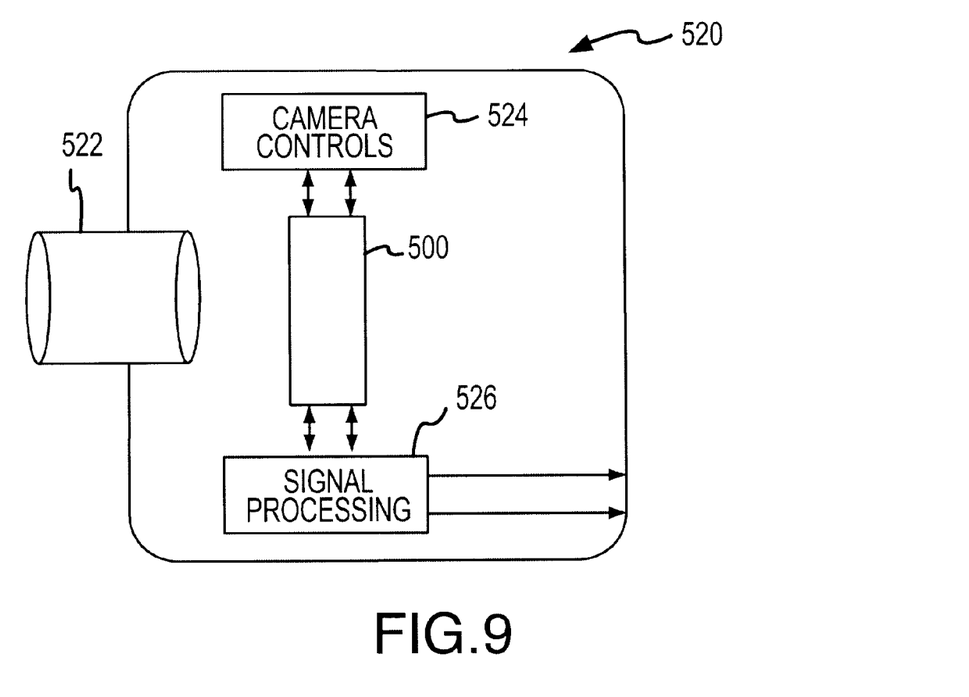
FIG. 9 is a schematic block diagram of a camera using one of the embodiments of a DAC circuit according to the present invention.

FIG. 9 shows a camera 520 that includes a lens assembly 522 to focus an image conjugate onto the sensor 500. The camera 520 also includes camera controls 524 and signal processing circuits 526. The camera controls may include basic electronic signal generators to control the sensor 500 and may include high level camera controls, such as operator actuator switches, to set exposure shutter, focus and any other type of camera manipulations. Signal processing circuits 526 may include basic signal processing, such as conversion of RGB signals into a composite color signal for broadcast in a NTSC, PAL or Seacam format, or it may include recording media and processing related thereto. The camera 520 advantagously operates with low power consumption since the camera 520 includes DACs according to the present invention having the above described power saving features.

Having described preferred embodiments of a low glitch current steering digital to analog converter and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed is:

1. A DAC circuit comprising:
   a reference input transistor;
   a plurality of current steered current sources each coupled to the reference input transistor and configured to provide a combined current source output; and
   an output current mirror having an input coupled to the combined current source output, the output mirror comprising:
      an input transistor having a first gate electrode, a first drain coupled to the first gate electrode, and a first source;
      a first output transistor having a second gate electrode coupled to the first gate electrode and to the combined current source output, a second drain, and a second source coupled to the first source, the first output transistor being scaled to pass an output current between the second drain and second source that is a predetermined proportion of an input current passed between the first drain and the first source;
      a third transistor scaled to match the input transistor and having a third gate electrode coupled to the first gate electrode, a third drain, and a third source coupled to the first source;
      a fourth transistor having a fourth gate electrode, a fourth drain coupled to the third drain, and a fourth source;
      a fifth transistor scaled to match the fourth transistor and having a fifth gate electrode coupled to the fourth gate electrode and to the fourth drain, a fifth drain and a fifth source coupled to the fourth source;
      a sixth transistor having a sixth gate electrode coupled to the second drain, a sixth drain coupled to the fifth drain and a sixth source coupled to the second source;
      a second output transistor having a seventh gate electrode coupled to the sixth drain, a seventh drain and a seventh source coupled to the second drain.

2. The circuit of claim 1, wherein the predetermined proportion is greater than unity.

3. A DAC circuit comprising:
   a reference input transistor;
   a plurality of current steered current sources each coupled to the reference input transistor and configured to provide a combined current source output; and an output current mirror having an input coupled to the combined current source output, the output mirror comprising:
  a first input transistor having a first gate electrode, a first drain and a first source; and
  a first output transistor having a second gate electrode, a second drain and a second source, the first and second gate electrodes being coupled together and to the combined current source output, the first and second sources being coupled together, the first output transistor being scaled to pass an output current between the second drain and second source that is a predetermined proportion of an input current passed between the first drain and the first source;
  a third transistor scaled to match the first input transistor and having a third gate electrode coupled to the first gate electrode, a third drain and a third source coupled to the first sources;
  a fourth transistor having a fourth gate electrode, a fourth drain coupled to the third drain and a fourth source;
  a fifth transistor scaled to match the fourth transistor and having a fifth gate electrode coupled to the fourth gate electrode and to the fourth drain, a fifth drain and a fifth source coupled to the fourth source;
  a sixth transistor having a sixth gate electrode coupled to the fifth drain, a sixth drain coupled to the fifth drain and a sixth source coupled to the second source;
  a second output transistor having a seventh gate electrode coupled to the sixth gate electrode, a seventh drain and a seventh source coupled to the second drain; and
  a second input transistor having an eighth gate electrode coupled to the sixth and seventh gate electrodes, an eighth drain coupled to the first gate electrode and an eighth source coupled to the first drain.

4. A DAC circuit comprising:
a reference input transistor;
a plurality of current steered current sources each coupled to the reference input transistor and configured to provide a combined current source output; and
an output current mirror having an input coupled to the combined current source output, the output current mirror comprising:
  one of a regulated cascode current mirror and a high-swing cascode current mirror, the output current mirror including an input transistor having a first gate electrode, a first drain and a first source, the output current mirror further including an output transistor having a second gate electrode coupled to the first gate electrode and to the combined current source output, a second drain and a second source coupled to the first source, the output transistor being scaled to pass an output current between the second drain and second source that is a predetermined proportion greater than one of an input current passed between the first drain and the first source;
  a third transistor scaled to match the input transistor and having a third gate electrode coupled to the first gate electrode, a third drain and a third source coupled to the first source;
  a fourth transistor having a fourth gate electrode, a fourth drain coupled to the third drain and a fourth source;
  a fifth transistor scaled to match the fourth transistor and having a fifth gate electrode coupled to the fourth gate electrode, a fifth drain and a fifth source, the fifth gate electrode being further coupled to the fourth drain;
  a sixth transistor having a sixth gate electrode, a sixth drain coupled to the fifth drain and a sixth source coupled to the second source; and
  another output transistor having a seventh gate electrode, a seventh drain and a seventh source coupled to the second drain.

5. A DAC circuit comprising:
a reference input transistor;
a plurality of current steered current sources each coupled to the reference input transistor and configured to provide a combined current source output; and
an output current mirror having an input coupled to the combined current source output, the output current mirror comprising:
  a high-swing cascode current mirror including a first input transistor having a first gate electrode, a first drain and a first source, the output current mirror further including a first output transistor having a second gate electrode coupled to the first gate electrode and to the combined current source output, a second drain and a second source coupled to the first source, the first output transistor being scaled to pass an output current between the second drain and second source that is a predetermined proportion greater than one of an input current passed between the first drain and the first source;
  a third transistor scaled to match the first input transistor and having a third gate electrode coupled to the first gate electrode, a third drain and a third source coupled to the first source;
  a fourth transistor having a fourth gate electrode, a fourth drain coupled to the third drain and a fourth source;
  a fifth transistor scaled to match the fourth transistor and having a fifth gate electrode coupled to the fourth gate electrode, a fifth drain and a fifth source, the fifth gate electrode being further coupled to the fourth drain;
  a sixth transistor having a sixth gate electrode coupled to the fifth drain, a sixth drain coupled to the fifth drain and a sixth source coupled to the second source;
  a second output transistor having a seventh gate electrode coupled to the sixth gate electrode, a seventh drain and a seventh source coupled to the second drain; and
  a second input transistor having an eighth gate electrode coupled to the sixth and seventh gate electrodes, an eighth drain and an eighth source coupled to the first drain.

6. A DAC circuit comprising:
a reference input transistor;
a plurality of current steered current sources each coupled to the reference input transistor and configured to provide a combined current source output; and
an output current mirror having an input coupled to the combined current source output, the output current mirror comprising:
  an input transistor having a first gate electrode, a first drain and a first source;
  a first output transistor having a second gate electrode coupled to the first gate electrode, a second drain and a second source coupled to the first source;

a second output transistor having a third gate electrode coupled to the first and second gate electrodes and to the combined current source output, a third drain and a third source coupled to the first and second sources;

a first switch transistor having a fourth gate electrode, a fourth drain and a fourth source coupled to the second drain; and a second switch transistor having a fifth gate electrode, a fifth drain coupled to the fourth drain and a fifth source coupled to the third drain.

7. A DAC circuit comprising:

a reference input transistor;

a plurality of current steered current sources each coupled to the reference input transistor and configured to provide a combined current source output; and an output current mirror having an input coupled to the combined current source output; and an input current mirror comprising:

an input transistor having a first gate electrode, a first drain and a first source;

a first output transistor having a second gate electrode coupled to the first gate electrode and to the first drain, a second drain and a second source coupled to the first source;

a second output transistor having a third gate electrode coupled to the first and second gate electrodes and to the first drain, a third drain and a third source coupled to the first and second sources;

a first switch transistor having a fourth gate electrode, a fourth drain and a fourth source coupled to the second drain; and a second switch transistor having a fifth gate electrode, a fifth drain coupled to the fourth drain and a fifth source coupled to the third drain.

8. The circuit of claim 7, wherein the output current mirror further comprises:

an input transistor having a sixth gate electrode, a sixth drain and a sixth source;

a first output transistor having a seventh gate electrode coupled to the sixth gate electrode and to the combined current source output, a seventh drain and a seventh source coupled to the sixth source;

a second output transistor having an eighth gate electrode coupled to the sixth and seventh gate electrodes and to the combined current source output, an eighth drain and an eighth source coupled to the sixth and seventh sources;

a first switch transistor having a ninth gate electrode, a ninth drain and a ninth source coupled to the seventh drain; and a second switch transistor having a tenth gate electrode, a tenth drain coupled to the ninth drain and a tenth source coupled to the eighth drain.

9. A sensor comprising at least one DAC circuit, the at least one DAC circuit comprising a reference input transistor, a plurality of current steered current sources each coupled to the reference input transistor and configured to provide a combined current source output, and an output current mirror having an input coupled to the combined current source output, the output current mirror comprising:

an input transistor having a first gate electrode, a first drain coupled to the first gate electrode, and a first source;

an first output transistor having a second gate electrode, a second drain and a second source, the first and second gate electrodes being coupled together and to the combined current source output, the first and second sources being coupled together, the first output transistor being scaled to pass an output current between the second drain and second source that is a predetermined proportion of an input current passed between the first drain and the first source;

a third transistor scaled to match the input transistor and having a third gate electrode coupled to the first gate electrode, a third drain and a third source coupled to the first source;

a fourth transistor having a fourth gate electrode, a fourth drain coupled to the third drain and a fourth source;

a fifth transistor scaled to match the fourth transistor and having a fifth gate electrode coupled to the fourth gate electrode and coupled to the fourth drain, a fifth drain and a fifth source;

a sixth transistor having a sixth gate electrode coupled to the second drain, a sixth drain coupled to the fifth drain and a sixth source coupled to the second source; and a second output transistor having a seventh gate electrode coupled to the sixth drain, a seventh drain and a seventh source coupled to the second drain.

10. A sensor comprising at least one DAC circuit, the at least one DAC circuit comprising a reference input transistor, a plurality of current steered current sources each coupled to the reference input transistor and configured to provide a combined current source output, and an output current mirror having an input coupled to the combined current source output, the output current mirror comprising:

a first input transistor having a first gate electrode, a first drain and a first source;

an first output transistor having a second gate electrode, a second drain and a second source, the first and second gate electrodes being coupled together and to the combined current source output, the first and second sources being coupled together, the first output transistor being scaled to pass an output current between the second drain and second source that is a predetermined proportion of an input current passed between the first drain and the first source;

a third transistor scaled to match the first input transistor and having a third gate electrode coupled to the first gate electrode, a third drain and a third source coupled to the first source;

a fourth transistor having a fourth gate electrode, a fourth drain coupled to the third drain and a fourth source;

a fifth transistor scaled to match the fourth transistor and having a fifth gate electrode coupled to the fourth gate electrode and coupled to the fourth drain, a fifth drain and a fifth source;

a sixth transistor having a sixth gate electrode, a sixth drain coupled to the fifth drain and a sixth source coupled to the second source; and a second output transistor having a seventh gate electrode, a seventh drain and a seventh source coupled to the second drain;

a second input transistor having an eighth gate electrode, an eighth drain coupled to the first gate electrode and an eighth source coupled to the first drain, the sixth gate electrode being coupled to the fifth drain, the sixth, seventh and eighth gate electrodes being coupled together.

11. A camera comprising a sensor including at least one DAC circuit, the at least one DAC circuit comprising a reference input transistor, a plurality of current steered current sources each coupled to the reference input transistor and configured to provide a combined current source output, and an output current mirror having an input coupled to the combined current source output, the output current mirror comprising:
- an input transistor having a first gate electrode, a first drain coupled to the first gate electrode, and a first source;
- a first output transistor having a second gate electrode, a second drain and a second source, the first and second gate electrodes being coupled together and to the combined current source output, the first and second sources being coupled together, the first output transistor being scaled to pass an output current between the second drain and second source that is a predetermined proportion of an input current passed between the first drain and the first source;
- a third transistor scaled to match the input transistor and having a third gate electrode coupled to the first gate electrode, a third drain and a third source coupled to the first source;
- a fourth transistor having a fourth gate electrode, a fourth drain coupled to the third drain and a fourth source;
- a fifth transistor scaled to match the fourth transistor and having a fifth gate electrode, a fifth drain and a fifth source, the fourth and fifth gate electrodes being coupled together and to the fourth drain;
- a sixth transistor having a sixth gate electrode coupled to the second drain, a sixth drain coupled to the fifth drain and a sixth source coupled to the second source; and
- a second output transistor having a seventh gate electrode coupled to the sixth drain, a seventh drain and a seventh source coupled to the second drain.

12. A camera comprising a sensor including at least one DAC circuit, the at least one DAC circuit comprising a reference input transistor, a plurality of current steered current sources each coupled to the reference input transistor and configured to provide a combined current source output, and an output current mirror having an input coupled to the combined current source output, the output current mirror comprising:
- a first input transistor having a first gate electrode, a first drain and a first source;
- a first output transistor having a second gate electrode, a second drain and a second source, the first and second gate electrodes being coupled together and to the combined current source output, the first and second sources being coupled together, the first output transistor being scaled to pass an output current between the second drain and second source that is a predetermined proportion of an input current passed between the first drain and the first source;
- a third transistor scaled to match the first input transistor and having a third gate electrode coupled to the first gate electrode, a third drain and a third source coupled to the first source;
- a fourth transistor having a fourth gate electrode, a fourth drain coupled to the third drain and a fourth source;
- a fifth transistor scaled to match the fourth transistor and having a fifth gate electrode, a fifth drain and a fifth source, the fourth and fifth gate electrodes being coupled together and to the fourth drain;
- a sixth transistor having a sixth gate electrode, a sixth drain coupled to the fifth drain and a sixth source coupled to the second source;
- a second output transistor having a seventh gate electrode, a seventh drain and a seventh source coupled to the second drain; and
- a second input transistor having an eighth gate electrode, an eighth drain coupled to the first gate electrode and an eighth source coupled to the first drain, the sixth gate electrode being coupled to the fifth drain, the sixth, seventh and eighth gate electrodes are coupled together.

13. A method comprising:
applying a reference current to a reference input transistor that is coupled to a plurality of current steered current sources;
converting plural digital signals into a combined current source output from the plurality of current steered current sources based on the reference current;
coupling an input of an output current mirror to the combined current source output; and
providing a circuit output current at an output of the output current mirror, a magnitude of the circuit output current being greater than a magnitude of the combined current source output, the circuit output current being provided by controlling output current mirror switches to selectively control an output current mirror gain ratio defined as the magnitude of the circuit output current divided by the magnitude of the combined current source output so that the output current mirror gain ratio is one of a first predetermined output gain ratio and a second predetermined output gain ratio, the first predetermined output gain ratio being different than the second predetermined output gain ratio.

14. A method comprising:
applying a reference current to a reference input transistor that is coupled to a plurality of current steered current sources;
converting plural digital signals into a combined current source output from the plurality of current steered current sources based on the reference current by providing an input current mirror output current from an input current mirror portion of a current steered DAC by controlling input current mirror switches to selectively control the input current mirror output current to be one of a first predetermined output current and a second predetermined output current, the first predetermined output current being different than the second predetermined output current;
coupling an input of an output current mirror to the combined current source output; and
providing a circuit output current at an output of the output current mirror, a magnitude of the circuit output current being greater than a magnitude of the combined current source output.

15. The method of claim 14, wherein:
an output current mirror gain ratio is defined by a magnitude of the circuit output current divided by the magnitude of the combined current source output; and
the providing of a circuit output current includes controlling output current mirror switches to selectively control the output current mirror gain ratio to be one of a first predetermined output gain ratio and a second predetermined output gain ratio, the first predetermined output gain ratio being different than the second predetermined output gain ratio.

16. A method comprising:
applying a reference current to a reference input transistor that is coupled to a plurality of current steered current sources;

converting plural digital signals into a combined current source output from the plurality of current steered current sources based on the reference current;

coupling an input of an output current mirror to the combined current source output; and providing a circuit output current at an output of the output current mirror having a magnitude that is at least ten times greater than a magnitude of the combined current source output.

17. A method comprising:

applying a reference current to a reference input transistor that is coupled to a plurality of current steered current sources;

converting plural digital signals into a combined current source output from the plurality of current steered current sources based on the reference current;

coupling an input of an output current mirror to the combined current source output; and providing a circuit output current at an output of the output current mirror having a magnitude that is at least one hundred times greater than a magnitude of the combined current source output.

18. A method comprising:

applying a reference current to a reference input transistor that is coupled to a plurality of current steered current sources;

converting plural digital signals into a combined current source output from the plurality of current steered current sources based on the reference current;

coupling an input of an output current mirror to the combined current source output; and providing a circuit output current at an output of the output current mirror having a magnitude that is at least one thousand times greater than a magnitude of the combined current source output.

* * * * *